(12) United States Patent  (10) Patent No.: US 9,845,811 B1
Wang  (45) Date of Patent: Dec. 19, 2017

(54) HANGING STRUCTURE FOR A WALL FAN

(71) Applicant: AIR COOL INDUSTRIAL CO., LTD., Taichung (TW)

(72) Inventor: Cliff Wang, Taichung (TW)

(73) Assignee: AIR COOL INDUSTRIAL CO., LTD., Taichung (TW)

( * ) Notice: Subject to any disclaimer, the term of this patent is extended or adjusted under 35 U.S.C. 154(b) by 0 days.

(21) Appl. No.: 15/227,680

(22) Filed: Aug. 3, 2016

(51) Int. Cl.
*F04D 29/60* (2006.01)
*F04D 25/08* (2006.01)
*F04D 27/00* (2006.01)
*H05K 5/00* (2006.01)
*H05K 5/02* (2006.01)

(52) U.S. Cl.
CPC ........... *F04D 29/601* (2013.01); *F04D 25/08* (2013.01); *F04D 27/004* (2013.01); *H05K 5/0017* (2013.01); *H05K 5/0247* (2013.01); *F05B 2240/9112* (2013.01)

(58) Field of Classification Search
CPC ........... F16M 2200/044; F16M 13/027; A47G 33/1246; A47F 5/0892; H05K 7/20172; H05K 5/0017; H05K 5/0247; H05K 7/1474; F04D 27/004; F04D 29/601; F04D 25/08; F05B 2240/9112
USPC ............ 361/679.01; 248/317, 327, 342, 343, 248/222.52; 416/244 R
See application file for complete search history.

(56) References Cited

U.S. PATENT DOCUMENTS

| | | | | |
|---|---|---|---|---|
| 5,256,039 A * | 10/1993 | Crawford | ............... | F04D 25/105 416/100 |
| 5,720,594 A * | 2/1998 | Snow | ..................... | F04D 25/105 416/100 |
| 6,146,191 A * | 11/2000 | Kerr, Jr. | ................. | F04D 25/088 439/140 |
| 6,283,709 B1 * | 9/2001 | Hill | ........................ | F04D 25/105 416/100 |
| 6,336,793 B1 * | 1/2002 | Litvin | ................... | F04D 29/601 248/126 |
| 6,799,982 B2 * | 10/2004 | Kerr, Jr. | .................. | F21V 21/02 439/140 |
| 7,726,617 B2 * | 6/2010 | Zambelli | .............. | F16M 11/041 248/222.12 |
| 2007/0170336 A1 * | 7/2007 | Li | ........................ | B60R 11/0235 248/324 |
| 2007/0176067 A1 * | 8/2007 | Monaco | ................. | F16M 11/10 248/284.1 |

(Continued)

*Primary Examiner* — Steven T Sawyer
*Assistant Examiner* — Sagar Shrestha
(74) *Attorney, Agent, or Firm* — Ming Chow; Sinorica, LLC

(57) ABSTRACT

A hanging structure for a wall fan, able to hang a wall fan on a wall, includes a board and a casing. The board to be locked on a wall is provided thereon with at least one first hanging member and at least one first locking member. The casing is provided therein with at least one second hanging member by which the casing can be hung on the first hanging member of the board. The casing is further provided with at least one second locking member to be locked together with the first locking member of the board to have the casing firmly fixed on the board and roughly covering the board. The hanging structure for a wall fan of this invention can simplify aligning, positioning and locking operation and can be firmly hung on a wall to avoid displacement for attaining effect of protection of the wall fan.

10 Claims, 12 Drawing Sheets

(56) References Cited

U.S. PATENT DOCUMENTS

| | | | | |
|---|---|---|---|---|
| 2010/0033943 A1* | 2/2010 | Tsai | ............... | F16M 13/02 |
| | | | | 361/829 |
| 2011/0174939 A1* | 7/2011 | Taylor | ............... | F16M 11/10 |
| | | | | 248/201 |
| 2011/0198460 A1* | 8/2011 | Stifal | ............... | F16M 11/10 |
| | | | | 248/201 |
| 2012/0061541 A1* | 3/2012 | Huang | ............... | F16M 13/02 |
| | | | | 248/274.1 |
| 2012/0068042 A1* | 3/2012 | Carter | ............... | F04D 25/088 |
| | | | | 248/674 |
| 2014/0268511 A1* | 9/2014 | Martinez | ............... | H05K 5/02 |
| | | | | 361/679.01 |
| 2015/0275923 A1* | 10/2015 | Heli | ............... | F04D 25/068 |
| | | | | 415/127 |

* cited by examiner

HANGING STRUCTURE FOR A WALL FAN

BACKGROUND OF THE INVENTION

1. Field of the Invention

This invention relates to a wall fan, particularly to a hanging structure for a wall fan.

2. Description of the Prior Art

In order to use fans with convenience, save fan installing space effectively and increase circulating distance and range of air sent by fan blades, most users of fans will choose to have fans installed on a wall, thus needless to provide other spaces for placing fans. A first conventional hanging structure for a wall fan, as shown in FIG. 1, includes a hanging member 1 and a hooking member 2. The hooking member 2 is firmly locked on a wall 3, while the hanging member 1 is hung on the hooking member 2 and locked with a wall fan 4. Thus, to hang a wall fan on a wall, only have the hooking member 2 secured on the wall 3 in advance and then, have the hanging member 1 locked with the wall fan 4, and after having the hanging member 1 aligned to the hooking member 2, the hanging member 1 together with the wall fan 4 is hung on the hooking member 2, thus hanging the wall fan 4 on the wall 3. Since the hooking member 2 merely has supporting function; therefore, displacement between the hanging member 1 and the hooking member 2 may cause to happen and the wall fan 4 may fall off because of collision and earthquake.

To improve foresaid defect, a second conventional hanging structure for a wall fan was developed. The second conventional hanging structure for a wall fan, as shown in FIGS. 2 and 3, is formed with a hanging member 5 and a hooking member 6, which are the same as those described in the first preferred embodiment in use and characteristic and unnecessary to make superfluous statement. Different from the first conventional hanging structure, the second conventional hanging structure for a wall fan has two sides of the hanging member 5 respectively formed with a stop face so that when the hanging member 5 is hung on the hooking member 6, the hanging member 5 and the hooking member 6 will be impossible to carry out horizontal displacement, able to protect the wall fan 7 from falling off due to horizontal displacement of the hanging member 5. However, the hanging member 5 and the hooking member 6 can only carry out a single point of support but cannot be prevented from shifting longitudinally and thus, during shaking violently, the hanging member 5 may be disengaged from the hooking member 6 and the wall fan 7 may fall off. Therefore, the second conventional hanging structure for a wall fan still has to be ameliorated.

An improved conventional hanging structure for a wall fan, as shown in FIG. 4, includes two hanging members 8 and two hooking member 9, which are almost the same as those described in foresaid preferred embodiments in use and characteristic, except that the hanging members 8 and the hooking members 9 are increased in number and correspondingly provided on a wall and on a wall fan to have the hanging members 8 hung on the hooking members 9 to form doubt support for attaining effect of stability, thus improving foresaid risk that the hanging structure may be turned over and fall off when swaying violently. However, this improved hanging structure for a wall fan still cannot restrict the hanging members 8 and the hooking members 9 to shift longitudinally and further, before the hanging members 8 and the hooking members 9 are locked together, each other's spacing distance and position height must be accurately measured in advance; otherwise the hanging members 8 may be impossible to be hung on the hooking members 9; therefore, this hanging structure for a wall fan still has to be further improved.

Having observed foresaid defects of the conventional hanging structure for a wall fan, the inventor of this invention adheres to the spirit of constantly striving for perfection and concentrates on study and research for improving the hanging structure for a wall fan and hence devises this invention.

SUMMARY OF THE INVENTION

The objective of this invention is to offer a hanging structure for a wall fan, easy to be assembled with a wall fan and installed on a wall, able to simplify aligning, positioning and locking operation and enabling a wall fan to be firmly hung on a wall to avoid displacement for protection of the wall fan.

The hanging structure for a wall fan, able to have a wall fan firmly hung on a wall, includes a fixing unit provided with a board to be locked on a wall. The board is formed with at least one first hanging member and a least one first locking member, the first hanging member being longitudinally fixed on the board. A hanging unit contains a casing, which is fixed with the wall fan and serves as a power source control box. The casing is provided therein with at least one second hanging member by which the casing can be hung on the first hanging member of the board. The casing is further disposed with at least one second locking member corresponding to the first locking member of the board to enable the casing to be secured with the board from the outside via the first and the second locking members, with the casing roughly covering the board.

The hanging structure for a wall fan of this invention is easy to have the second hanging member of the casing and the first hanging member of the board aligned to each other, fixed in position and hung together, and by having the first locking member of the board and the second locking member of the casing locked together, the wall fan can be firmly hung on the wall and avoid displacement, attaining effect of protection of the wall fan.

BRIEF DESCRIPTION OF DRAWINGS

This invention will be better understood by referring to the accompanying drawings, wherein.

DETAILED DESCRIPTION OF THE PREFERRED EMBODIMENT

Figure 1:
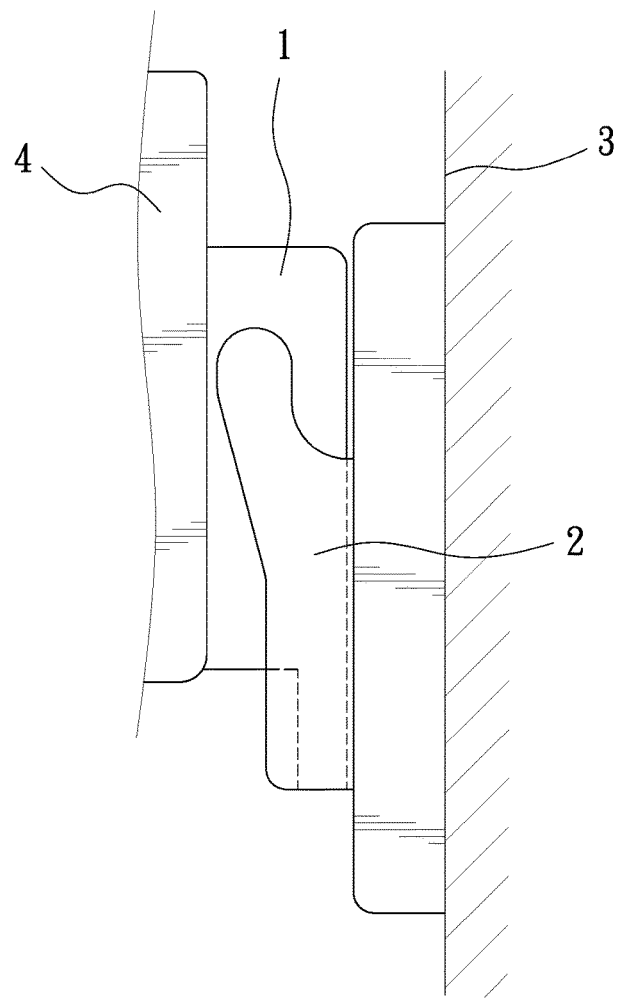
FIG. 1 is a schematic view of a first conventional hanging structure for a wall fan in a using condition.
Figure 2:
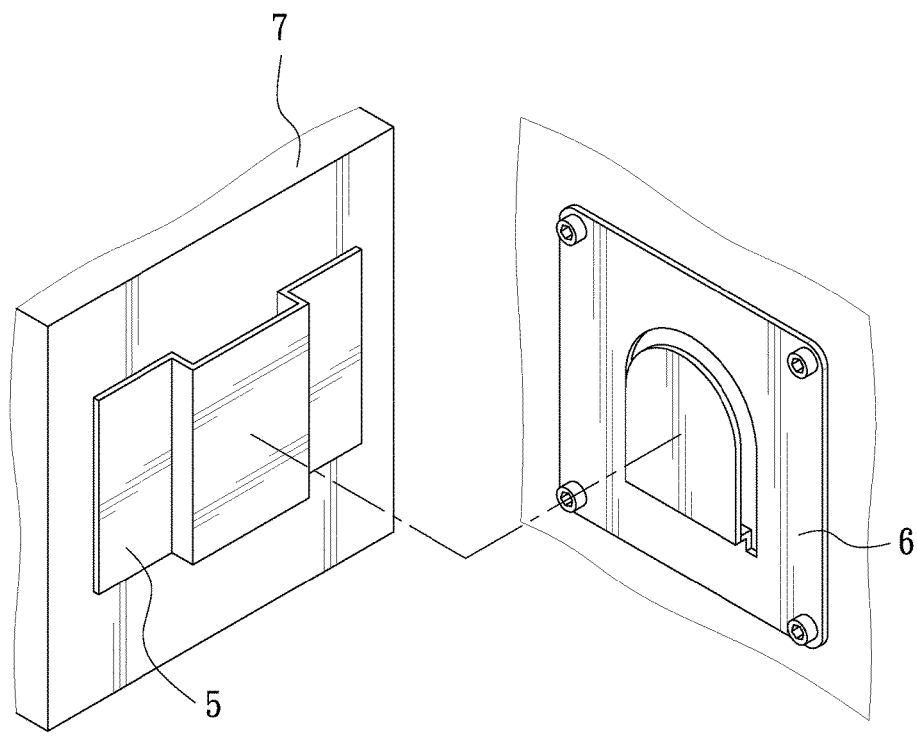
FIG. 2 is an exploded perspective view of a second conventional hanging structure for a wall fan.
Figure 3:
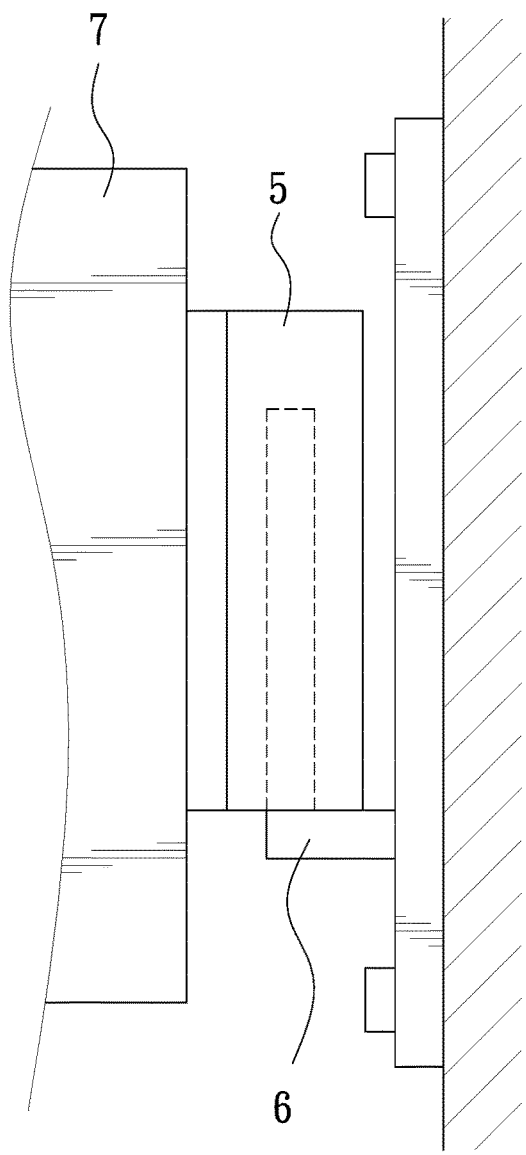
FIG. 3 is a schematic view of the second conventional hanging structure for a wall fan in a using condition.
Figure 4:
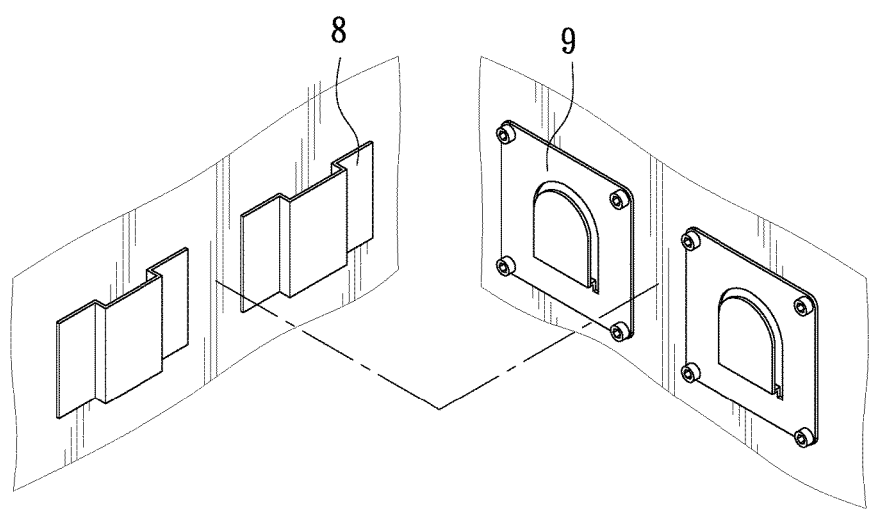
FIG. 4 is an exploded perspective view of an improved conventional hanging structure for a wall fan.
Figure 5:
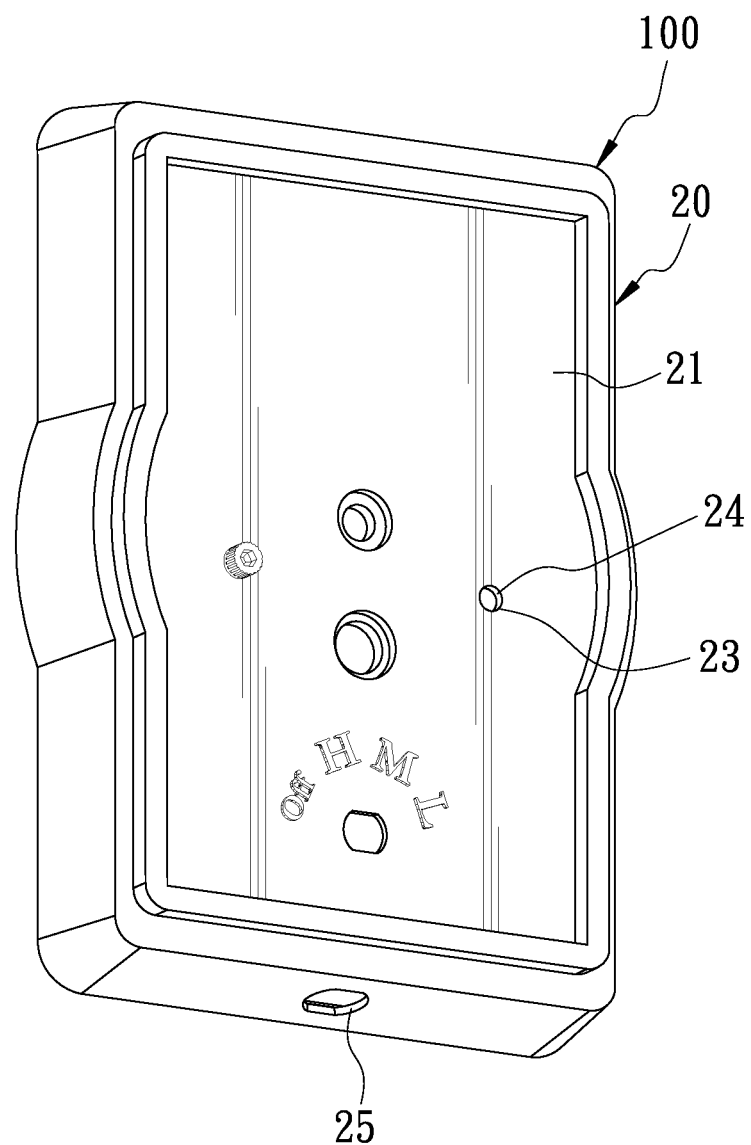
FIG. 5 is a perspective view of a first preferred embodiment of a hanging structure for a wall fan in the present invention, showing a state that a board is combined with a casing.
Figure 6:
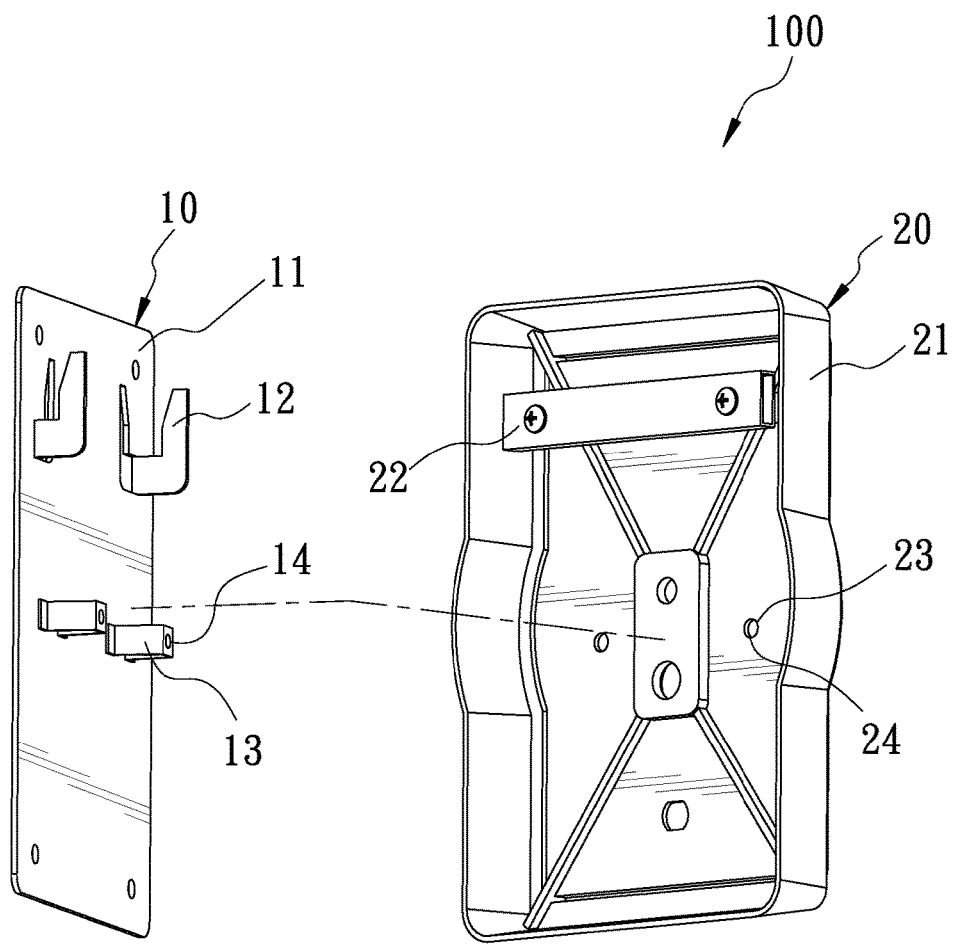
FIG. 6 is an exploded perspective view of the first preferred embodiment of the hanging structure for a wall fan in the present invention, showing a state that the board is detached from the casing.

A first preferred embodiment of a hanging structure 100 for a wall fan in the present invention, as shown in FIGS. 5 and 6, includes a fixing unit 10 and a hanging unit 20 as main components combined together.

The fixing unit 10 consists of a board 11 to be locked on a wall. The board 11 is provided thereon with two first hanging members 12 and two first locking members 13, and the two first locking members 13 are longitudinally fixed on the board 11 and respectively bored with a threaded hole 14, which is spaced apart from the board 11. The two first hanging members 12 are respectively a hook, formed integrally with the board 11 and fixed longitudinally on the board 11.

The hanging unit 20 contains a casing 21 fixed on the wall fan and serving as a power source control box. The casing 21 is provided therein with a second hanging member 22, which is a cross bar spaced apart from the casing 21 and by which the casing 21 can be hung on the first hanging members 12 of the board 11. Further, the casing 21 is formed with two second locking members 23 respectively corresponding to the first locking members 13 of the board 11, and the second locking members 23 are respectively a locking hole 24 corresponding with the threaded hole 14 of the first locking member 13 so that screws can be inserted through the locking holes 24 and screwed with the threaded hole 14 from the outside to lock the casing 21 on the board 11, letting the casing 21 roughly cover the board 11. The casing 21 is further formed with an opening 25 for power source wires of the wall fan to be inserted therethrough for facilitating connection of a power source.

Figure 7:
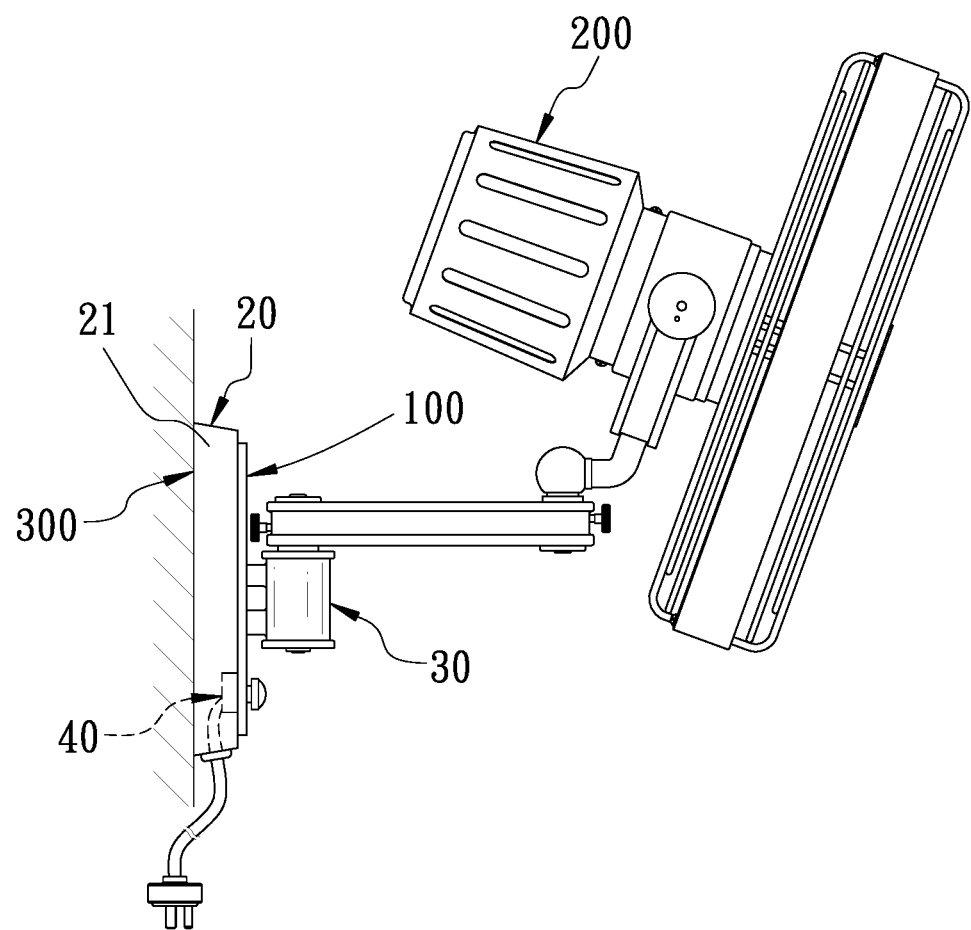
FIG. 7 is a schematic view of the first preferred embodiment of the hanging structure for a wall fan in use in the present invention, showing a state that a wall fan is hung on a wall via the hanging structure.
Figure 8:
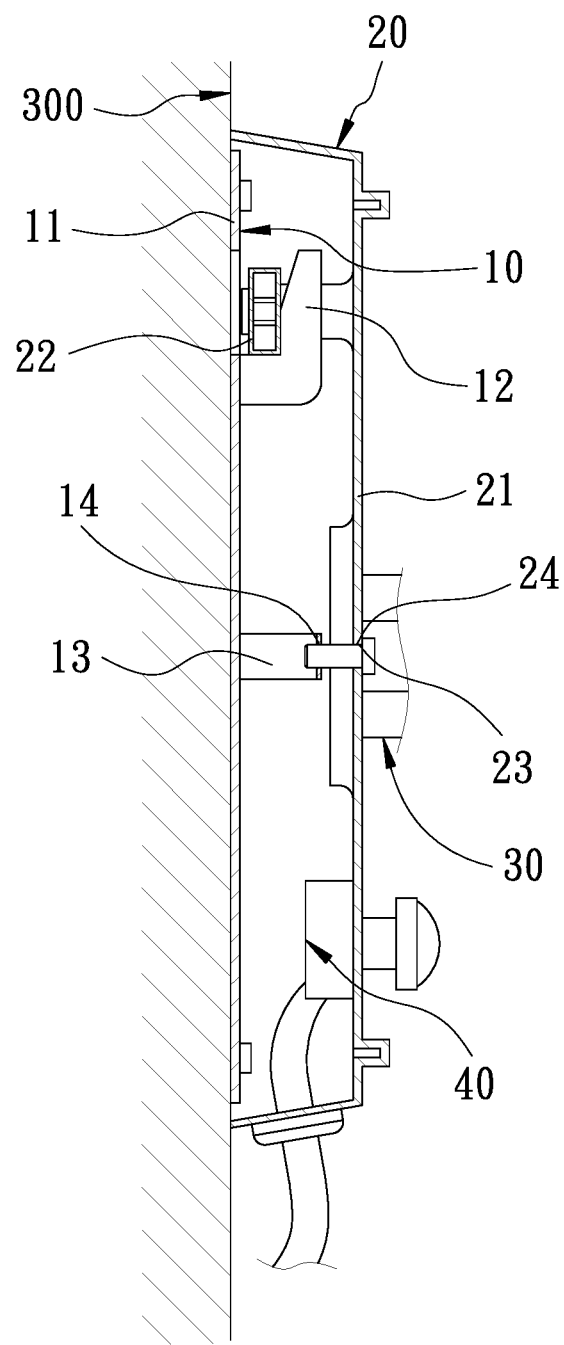
FIG. 8 is a schematic view of the first preferred embodiment of the hanging structure for a wall fan in use in the present invention, showing a state that the casing is hung and locked on the board.

Referring to FIGS. 7 and 8, the hanging structure 100 for a wall fan in the present invention, able to hang a wall fan 200 on a wall, further includes a connecting rod 21 and a wall fan control member 40.

The connecting rod 30 has one end connected with the casing 21 and another end connected with the wall fan 200.

The wall fan control member 40 is received in the casing 21 and extended out of the casing 21 and electrically connected with the wall fan 200 for controlling rotation speed and intensity of the wall fan 200.

Referring to FIGS. 6, 7 and 8, to make use of the hanging structure 100 for hanging the wall fan 200 on a wall, firstly, have the board 11 of the fixing unit 10 firmly locked on a wall 300 and then, make the second hanging member 22 of the casing 21 aligned to the first hanging members 12 of the board 11 and thus the casing 21 can easily be positioned and hung on the board 11. Lastly, screws are inserted through the second locking members 23 (locking holes 24) and screwed in the threaded holes 14 of the first locking members 13 to assemble the casing 21 on the board 11 and have the wall fan 200 hung on the wall 300 via the hanging structure 100.

Referring to FIGS. 6-8, since the first hanging members 12 are formed integrally with the board 11 and made in a metal processing way of punching press; therefore, the first hanging members 12 has good supporting and hanging functions. Moreover, by having the second hanging member 22 of the casing 21 hung on the first hanging members 12 of the board 11, aligning and positioning operation between the threaded holes 14 of the board 11 and the second locking members 23 (locking holes 24) of the casing 21 can be completed at the same time, able to simplify locking operation out of the casing 21. Thus, by having the board 11 and the casing 21 of the hanging structure 100 assembled together, the risk that positioning and locking operation of the conventional hanging structure always results in failure because of wrong measure in space and distance can be eliminated. The hanging structure for a wall fan of this invention is impossible to carry out horizontal and longitudinal displacement and hence can be firmly hung on a wall, able to attain effect of protection and improve the shortcomings that the conventional hanging structure can only be prevented from shifting horizontally but cannot avoid carrying out longitudinal displacement. Further, the casing 21 can roughly cover the board 11, able to increase visual beauty.

Figure 9:
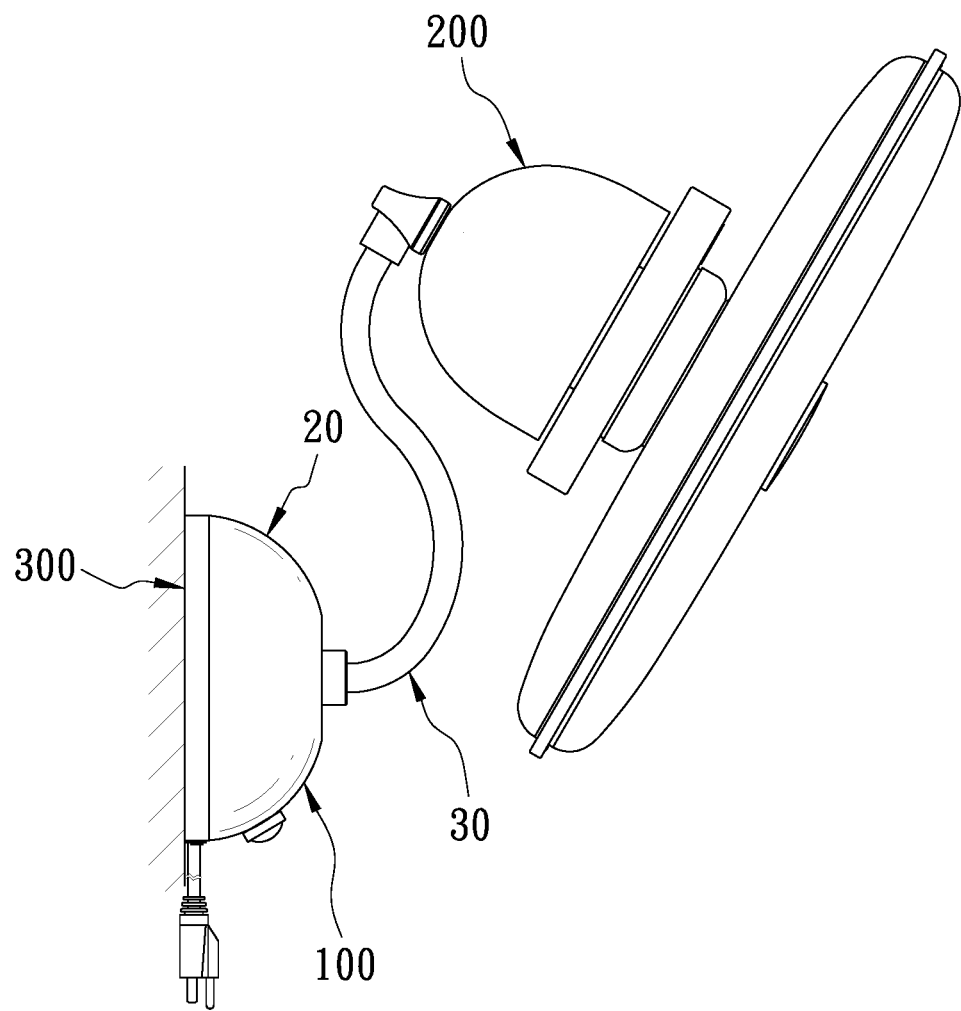
FIG. 9 is schematic view of a second preferred embodiment of the hanging structure for a wall fan in use in the present invention, showing a state that a wall fan is hung on a wall via the hanging structure.
Figure 10:
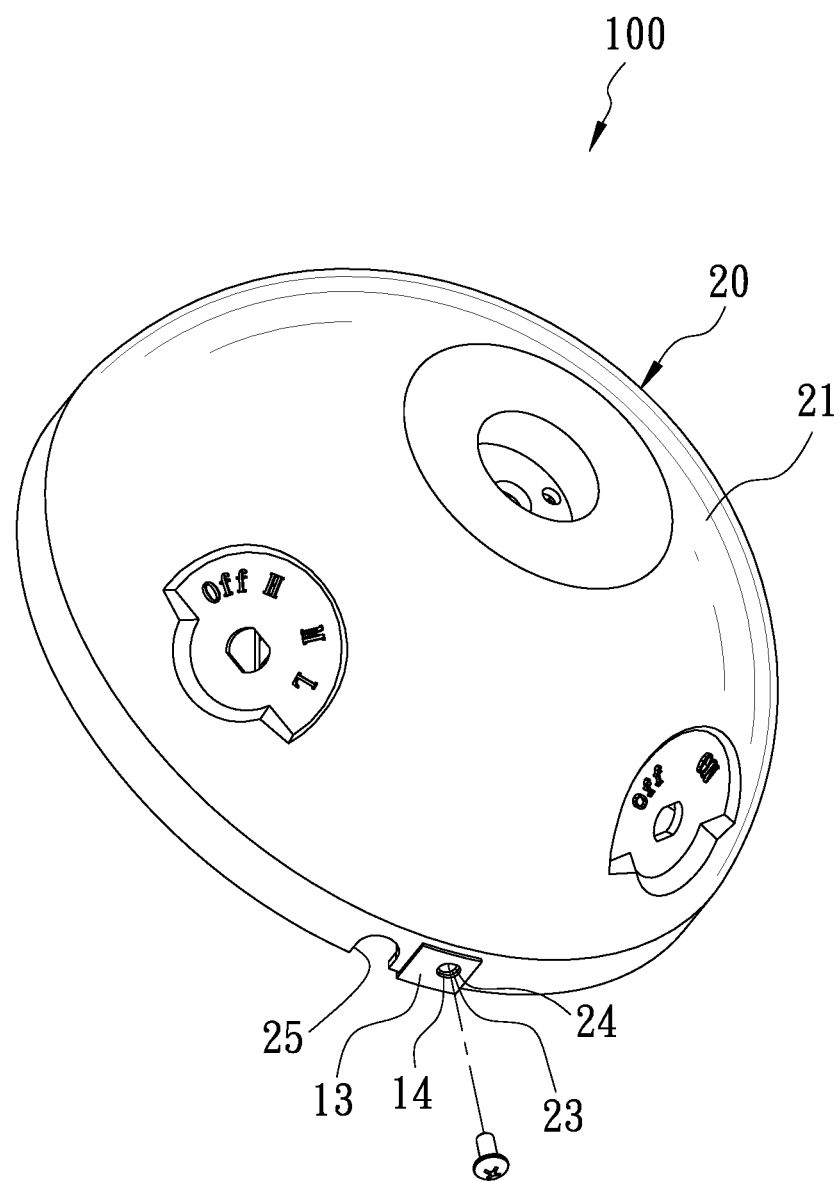
FIG. 10 is a perspective view of the second preferred embodiment of the hanging structure for a wall fan in the present invention, showing a state that a board is combined with a casing.
Figure 11:
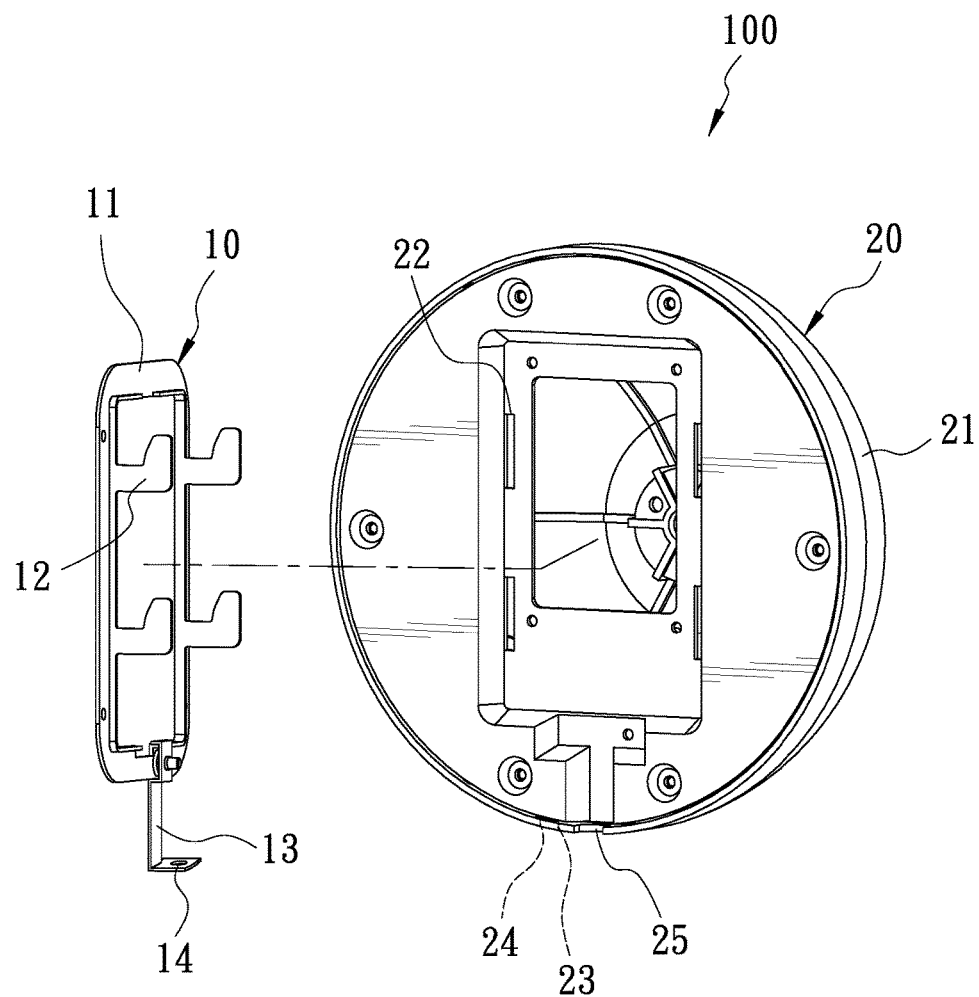
FIG. 11 is an exploded perspective view of the second preferred embodiment of the hanging structure for a wall fan in the present invention, showing a state that the board is detached from the casing.

A second preferred embodiment of a hanging structure 100 for a wall fan in the present invention, as shown in FIGS. 9, 10 and 11, has the board 11 of the fixing unit 10 provided thereon with four first hanging members 12 and a first locking member 13, and the casing 21 of the hanging unit 20 provided with four second hanging members 22 and a second locking member 23 (locking hole 24). The first hanging members 12 are respectively a hook, and the second hanging members 22 are respectively an insert hole and thus, the casing 21 can be hung on the first hanging members 12 of the board 11 via the second hanging members 22. The first locking member 13 of the fixing unit 10 is extended out of the casing 21 to make the threaded hole 14 of the first locking member 13 and the second locking member 23 (locking hole 24) of the casing 21 aligned to each other so that a screw can be inserted in both the threaded hole 14 and the second locking member 23 (locking hole 24) from the outside for firmly locking the casing 21 on the board 11.

Figure 12:
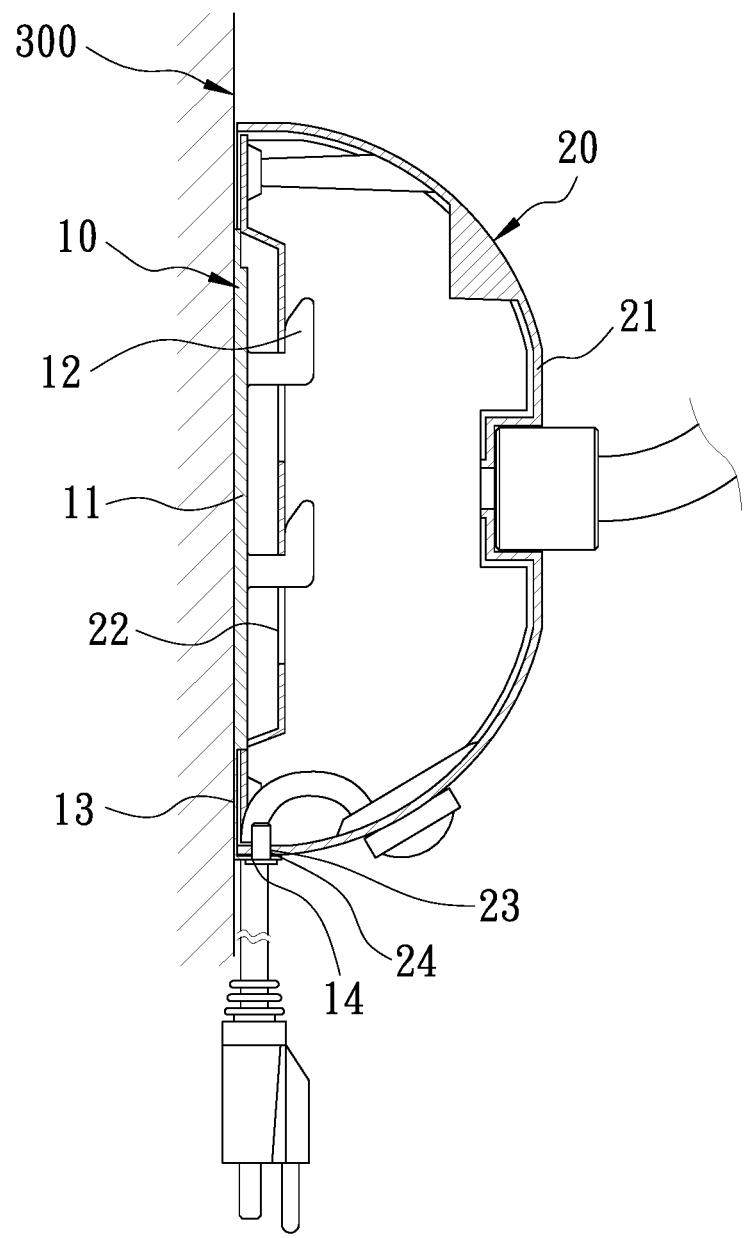
FIG. 12 is a schematic view of the second preferred embodiment of the hanging structure for a wall fan in use in the present invention, showing a state that the board is combined with the casing and the board is secured on a wall.

Referring to FIGS. 11 and 12, compared with the first preferred embodiment, the second preferred embodiment that is provided with the four second hanging members 12 is easy to attain aligning and positioning effects and has good supporting function and further can evenly distribute hanging load of the first hanging members 12, able to support the hanging structure more stably. In addition, the first locking member 13 of the fixing unit 10 is extended out of the casing 21 to let the threaded hole 14 of the first locking member 13 and the second locking member 23 (locking hole 24) of the casing 21 corresponding with each other, not only facilitating carrying out aligning and locking operation from the outside, but also stabilizing the hanging structure after the hanging structure is locked. And by so designing, the hanging structure 100 and the wall fan 200 are impossible to carry out horizontal and longitudinal displacement, thus achieving effect of protection.

To sun up, the hanging structure for a wall fan of this invention is easy to have the second hanging members of the casing and the first hanging members of the board aligned mutually, fixed in position and hung together, and the first locking member of the board and the second locking member of the casing can conveniently be locked together to complete hanging a wall fan on a wall. Thus, the wall fan can be firmly hung on a wall to avoid displacement, able to attain effect of protection and simplify aligning, positioning and locking operation.

While the preferred embodiments of the invention have been described above, it will be recognized and understood that various modifications may be made therein and the appended claims are intended to cover all such modifications that may fall within the spirit and scope of the invention.

What is claimed is:

1. A hanging structure comprising:
   a fixing unit;
   the fixing unit comprising a board, a first hanging member and a first locking member;
   the board being configured to be firmly locked on a wall;
   the first hanging member and the first locking member each being longitudinally fixed on the board;
   a hanging unit;
   the hanging unit comprising a casing, a second hanging member and a second locking member;
   the casing being configured to be secured on a wall fan and being configured to be served as a power source control box;
   the second hanging member being disposed on the casing;
   the casing being connected with the board by the second hanging member being hung on the first hanging member;
   the second locking member being formed on the casing;
   the second locking member corresponding to the first locking member;
   the casing being firmly locked on the board by the first locking member and the second locking member being locked with each other;
   the casing covering the board;
   a screw;
   the first locking member and the second locking member being locked with each other by the screw being screwed into the first locking member and the second locking member;
   the first locking member and the second locking member being located offset from each other without contacting against each other in response to the screw being screwed into the first locking member and the second locking member; and
   the first hanging member being formed by performing a punching press on the board.

2. The hanging structure as claimed in claim 1 comprising:
   the first hanging member being formed integrally with the board.

3. The hanging structure as claimed in claim 1 comprising:
   the fixing unit comprising a threaded hole;
   the threaded hole being bored on the first locking member;
   the hanging unit comprising a locking hole;
   the locking hole being bored on the second locking member; and
   the locking hole and the threaded hole corresponding with each other.

4. The hanging structure as claimed in claim 3 comprising:
   the threaded hole being located offset from the board.

5. The hanging structure as claimed in claim 1 comprising:
   the first locking member being extended out of the casing in response to the casing being connected with and firmly locked on the board.

6. The hanging structure as claimed in claim 1 comprising:
   the first hanging member comprising a hook;
   the second hanging member comprising an insert hole; and
   the hook being inserted into the insert hole.

7. The hanging structure as claimed in claim 1 comprising:
   the first hanging member comprising a hook;
   the second hanging member comprising a cross bar;
   the casing comprising an inner surface;
   the cross bar being located offset from the inner surface; and
   the cross bar being hung on the hook.

8. The hanging structure as claimed in claim 1 comprising:
   a connecting rod;
   the connecting rod comprising two ends;
   one of the two ends being connected with the casing; and
   the other one of the two ends being configured to be connected with the wall fan.

9. The hanging structure as claimed in claim 1 comprising:
   a wall fan control member;
   a portion of the wall fan control member being received in the casing;
   another portion of the wall fan control member being extended out of the casing; and
   the wall fan control member being configured to be electrically connected with the wall fan for controlling rotation speed and intensity of the wall fan.

10. The hanging structure as claimed in claim 1 comprising:
    the hanging unit comprising an opening;
    the opening being the formed on the casing; and
    the opening being configured to be used for receiving power source wires of the wall fan.

* * * * *